United States Patent [19]

Kalbskopf et al.

[11] 4,446,815

[45] May 8, 1984

[54] APPARATUS FOR CONTINUOUSLY DEPOSITING A LAYER OF A SOLID MATERIAL ON THE SURFACE OF A SUBSTRATE BROUGHT TO A HIGH TEMPERATURE

[75] Inventors: Reinhard Kalbskopf, Vordemwald; Otto Baumberger, Carouge, both of Switzerland; Serge Masson, Orange, France

[73] Assignee: Societa Italiana Vetro SIV SpA, San Salvo, Italy

[21] Appl. No.: 449,773

[22] Filed: Dec. 14, 1982

[30] Foreign Application Priority Data

Dec. 22, 1981 [CH] Switzerland ........................ 8211/81

[51] Int. Cl.³ .......................... B05B 7/00; C23C 13/10
[52] U.S. Cl. ...................................... 118/718; 118/725; 118/729; 239/422; 239/433
[58] Field of Search ............... 118/715, 718, 719, 729, 118/725; 427/255, 255.1, 255.2, 255.5; 65/60.5, 60.51, 60.52; 239/422, 433

[56] References Cited

U.S. PATENT DOCUMENTS

| | | | |
|---|---|---|---|
| 4,088,471 | 5/1978 | Kirkbride et al. | 118/718 X |
| 4,123,244 | 10/1978 | Leclercq et al. | 118/326 X |
| 4,188,199 | 2/1980 | Van Laethem et al. | 118/718 X |
| 4,351,267 | 9/1982 | Kalbskopf et al. | 118/718 |
| 4,361,284 | 11/1982 | Kalbskopf et al. | 118/718 X |

Primary Examiner—John D. Smith
Assistant Examiner—Bernard F. Plantz
Attorney, Agent, or Firm—Karl F. Ross; Herbert Dubno

[57] ABSTRACT

The apparatus comprises a nozzle (2) having three converging tuyeres (3, 4, 5) which project the reagents ($SnCl_4$ and $H_2O$) in the gaseous phase onto the substrate to be plated. Deflector members (6a, 6b), which are adapted to channel the gases between themselves and the substrate, extend on either side of the nozzle (2). The surface (51) of the deflector member (12) which extends in the opposite direction to the direction of movement of the substrate with respect to the nozzle is parallel to the substrate, and the edge (53) which it forms at an acute angle with the extended external wall (5b) of the third tuyere (5) is transversely offset in the direction of the said movement with respect to the axial median plane of the tuyere (3). On the other hand, the surface (52) of the second deflector member (5a) forms a blunt edge (54) with the corresponding longitudinal wall (4b) of the second tuyere. The opening of the nozzle between the edges (53, 54) is therefore effectively bent and the gases emerging therefrom are regularly deflected in the direction of movement of the substrate.

5 Claims, 4 Drawing Figures

APPARATUS FOR CONTINUOUSLY DEPOSITING A LAYER OF A SOLID MATERIAL ON THE SURFACE OF A SUBSTRATE BROUGHT TO A HIGH TEMPERATURE

1. TECHNICAL FIELD

Various methods and devices have already been proposed for the purpose of covering a substrate, for example, a glass plate, with a layer of a semiconductor material, for example tin oxide, a layer which must simultaneously have a transparency which is quite similar to that of the substrate, a relatively low electrical resistivity, and a high mechanical strength.

2. PRIOR ART

Amongst other methods, attempts have thus particularly been made to use for this purpose the technique known under the English name of Chemical Vapor Deposition or CVD. A method and a device are particularly known, from an article by H. Koch, "Elektrische Untersuchungen an Zinndioxydschichten" (see Phys. Stat. 1963, vol. 3, pages 1059 and following), for depositing a thin layer of $SnO_2$ on a small glass plate by reacting $SnCl_4$ and $H_2O$, which are brought in a diluted form in a carrier gas (in this case air) into mutual contact with the surface of the small glass plate, which has been previously heated to a temperature of the order of 200° to 400° C. These two gaseous reagents are projected onto the glass by means of a nozzle having two coaxial tuyeres (jet ducts), the central tuyere receiving the gaseous $SnCl_4$ dilution, while the external tuyere is supplied with the gaseous $H_2O$ dilution.

A method and a device very similar to the preceding ones have also been proposed, particularly in German specification DE-A-2 123 274, which also permit the $SnO_2$ layer deposited on a substrate, in this case also a small glass plate, to be doped with antimony in order to reduce the electrical resistance of the layer. For this purpose $SbCl_3$ has also been used in particular in a diluted form in a carrier gas (in this case nitrogen) which is brought in the presence of $SnCl_4$ and $H_2O$ above the substrate by means of a nozzle having three coaxial tuyeres, each of which receives one of the above-mentioned components. The combination reaction thus takes place near the substrate and at a certain distance from the three tuyeres of the nozzle.

The methods and devices used in both the above cases are intended solely for depositing a layer of $SnO_2$, doped or not, on relatively small plates on which this covering operation is carried out by relative lateral displacement of the nozzle and the small plates. The deposit which is obtained is thus in the form of a tin oxide strip having quite unequal transparency properties over the entire length of this strip. In fact the mixture of the reagents coming from a nozzle of the described type is not perfectly homogeneous, as a result of which the deposit which is obtained has variable zones of thickness and composition in the form of striae parallel to the axis of relative movement followed by the nozzle and the substrate.

It should be noted at this point that, although they are nevertheless acceptable when relatively small substrates are to be covered, the methods and devices described above prove to be practically useless for important industrial uses relating to covering particularly extensive substrates, as for example in the case of practically endless glass strips, which may be several meters wide, as are obtained, for example, by the method called the "Float" method.

In fact, if the above-mentioned methods and devices were intended to be used for an application of this type, it would be necessary either to arrange a plurality of nozzles of the above-described type side by side over the entire width of the glass strip, which would result in a very complex apparatus, or only to use a limited number of nozzles, which a mechanism would have to draw above the strip, in a very fast alternating movement, transversely to the axis of movement of the strip, so as to ensure that the entire surface of this strip is covered. It is obvious that none of these solutions would permit a $SnO_2$ coating to be obtained which would be sufficiently homogeneous to simultaneously have the high electrical conductivity, the transparency, and the general appearance of high quality desired for the finished product. As this glass is intended for making windows or doors of buildings and for making windows or windscreens of vehicles of all types, for example, it is obvious that such properties are highly desirable.

The capacity that the $SnO_2$ coatings should have of not preventing mechanical or heat treatments to which the glass sheets may usually be subjected should also be added to these properties. In particular, it would be necessary for such glass sheets covered with $SnO_2$, doped or not, to be suitable for diamond cutting, by action on either of its faces, without the qualities of the $SnO_2$ coating being affected. Similarly, it would be necessary to be able to subject the glass plates obtained by cutting such glass sheets to a tempering operation, without any mechanical or optical deterioration of its coating. Finally, it would be desirable to be able to curve plates of this type under heat, particularly for the purpose of producing windscreens or rear windows of vehicles, for example, in this case also without changing the above-mentioned properties of low electrical resistivity, good mechanical strength, good transparency, and a light reflection which is as homogeneous as possible over the entire area of the plates.

All these properties cannot be obtained by using methods or devices of the previously described type, i.e. which only permit the individual treatment of a very small glass surface. It was probably preoccupations of the type mentioned above which led to the replacement of those methods and devices by the methods and devices which particularly constitute the subject matter of U.S. Pat. Nos. 3,850,679 and 3,888,649 and British Pat. No. 1,507,996.

In all these documents a device for distributing previously prepared reactive gases is generally used, these gases being directed over the surface of the glass sheet and simultaneously over the entire width of this sheet, in the form of two successive screens in the U.S. patents and in the form of a gaseous flow directed tangentially to the glass over a length determined by the sheet in the British patent.

These devices are not, however, suitable for implementing CVD methods of the type described above, which are adapted to deposit $SnO_2$ layers, doped or not, because the arrival of a gaseous mixture of $SnCl_4$ and $H_2O$ in the vicinity of the distribution opening of these devices would give rise to a premature and violent reaction of these components, taking into account the relatively high temperature, which is practically the same as that of the glass to be covered (of the order of 500°–600° C.), of the walls of the devices defining this opening. This results in two additional disadvantages, i.e. on one hand the more or less pronounced obstruction of the ejection opening of the distributor devices and, on the other hand, the production on the glass of a particularly inhomogeneous $SnO_2$ deposit, which therefore is of a very variable quality as regards all its electrical, mechanical, or physical aspects.

The above-mentioned disadvantages have been largely remedied by the method and the device described in British patent application GB-A-2 044 137, the object of which is to continuously deposit on the surface of a substrate brought to a high temperature a layer of a solid material resulting from the reaction of at least two reagents which are gaseous or diluted in a gas. This method is characterised in that the said flows are in the form of rectilinear, gaseous streams, the transverse profile of each converging towards an imaginary line of intersection which is common to all the flows; these streams and/or the substrate are disposed such that the said line is contained substantially in the plane of the said surface of the substrate; the substrate and the said streams are relatively displaced in a direction substantially perpendicular to the said common line and in a manner such as to keep this line substantially in the plane of the said surface of the substrate; the gases arising from the reaction resulting from the impact of the said flows on the substrate are forced to flow parallel to a predetermined portion of this substrate extending on both sides of the said line; and, finally, these gases are discharged at the end of the said substrate portion disposed opposite the said imaginary common line of intersection of the said streams.

In a particular embodiment of this method there are three gaseous streams which are in tangential contact in twos, the central stream being formed by the flow of the first reagent and the two lateral stream by the gaseous flow of the other reagent.

When this method is used in order to deposit on a substrate, particularly a glass sheet brought to a high temperature (of the order of 600° C. for example), a layer of $SnO_2$ by reacting liquid $SnCl_4$ and $H_2O$ vapor diluted in an inert carrier gas (such as nitrogen), the central gaseous stream will be formed by the gaseous $SnCl_4$ dilution, the two lateral streams being formed by the water vapor dilution.

The device for implementing the above-mentioned method is formed by an apparatus comprising:

a source of a first reagent which is gaseous or diluted in a carrier gas;

a source of a second reagent which is gaseous or diluted in a carrier gas;

a nozzle having three tuyeres, each of which has an opening formed by a rectilinear slit and whose lateral walls, which define the planes of the longitudinal edges of each slit, converge towards an imaginary line which is common to all the tuyeres, a first tuyere being adjacent, with a first longitudinal edge of its ejection opening, to a longitudinal edge of the ejection opening of a second tuyere and, with the second longitudinal edge of the said opening, to a longitudinal edge of the ejection opening of the third tuyere;

first and second deflector surfaces which extend over a given distance on either side of the said tuyeres from the second longitudinal edge of the ejection opening of the said and of the third tuyere, respectively, the said deflector surfaces being coplanar with respect to one another and with the longitudinal edges of the openings of the tuyeres of the nozzle and being kinematically rigid with the said nozzle;

a first distribution network connecting the source of the first reagent to the first tuyere of the nozzle;

a second distribution network connecting the source of the second reagent to the second and to the third tuyere of the nozzle;

means for moving the substrate and the nozzle in a relative movement in a direction substantially perpendicular to the said imaginary line;

means for maintaining constant, during the said relative movement, the distance separating the plane containing the said openings of the tuyeres of the nozzle and the said deflector surfaces from the said surface of the substrate;

at least one device being provided to discharge the reaction gases produced in the space between the said deflector surfaces and the surface of the substrate, from the ends of this space which are furthest from the openings of the said tuyeres.

The method and the apparatus described above actually permit the deposition, at a very high speed, on sheet or plate glass, of a $SnO_2$ layer of satisfactory homogeneity which guarantees qualities of a very high level as regards mechanical strength and electrical and optical characteristics of all types.

The prior art in the field of the present invention also comprises the following documents:

European Pat. application Ser. No. EP-A-0 023 471 describes a method and a device similar to that described in GB-A-2 044 137, the main difference lying in the fact that the carrier gas used for the application of the CVD technique contains a high proportion of reducing agent.

French Pat. application Ser. No. FR-A-2 288 068 particularly describes a method and a device for the deposition, by spraying a liquid, of a thin layer on the surface of a sheet material. The device in question comprises an atomization chamber provided with a spraying orifice which is open opposite the face of the sheet to be treated, and means for bringing into the atomization chamber on one hand the liquid to be sprayed and, on the other, a gaseous flow under pressure so as to project the liquid through the orifice of the chamber; the atomization chamber and its orifice extend in a substantially longitudinal direction and the means for bringing the liquid into the chamber comprise a duct which leads into the chamber through a slit extending along the chamber, parallel to the above-mentioned direction.

French Pat. application Ser. No. FR-A-2 068 937 describes a method and a device for forming a metal or a metallic compound coating on one face of a glass strip moving in the longitudinal direction. The described device particularly comprises means for supporting a hot glass strip, which moves longitudinally in a continuous manner, and means for discharging a fluid medium onto the face of a strip of this type. The said discharge means are formed and arranged so as to discharge at least one current of liquid medium onto the said face in a direction which is inclined with respect to the said face, such that the current has a speed component in the direction of movement of the strip, and the acute angle of incidence or the acute mean angle of incidence of a current of this type onto the said face, measured in a plane which is perpendicular to the said face and parallel to the longitudinal direction of movement of the strip, does not exceed 60°.

British Pat. application Ser. No. GB-A-2 068 937 describes a method and a device for applying a metal or metallic compound coating to the surface of a substrate of heated glass. The device particularly comprises means for moving the said substrate with respect to a projection of droplets of the coating product, and means for sweeping the surface to be covered with a gas, alternately backwards and forwards with respect to the direction of movement of the said surface.

European Pat. application Ser. No. EP-A-0 029 809 relates to a nozzle for the simultaneous projection onto a substrate of three gaseous reactive currents which are mixed in the immediate vicinity of the substrate, the reaction product then being deposited, in the form of a coating, on the said substrate. As regards its general form, this nozzle is very similar to that described in GB-A-2 044 137.

3. DESCRIPTION OF THE INVENTION

However, in spite of all the improvements brought about by recent prior art, attempts have been made to improve further the performance of an apparatus such as that described in GB-A-2 044 137, particularly as regards the evenness of the deposit and the constancy of its transparency. This has been achieved by slightly modifying the shape of the ejection passage of the reagents at the outlet of the tuyeres.

The present invention provides apparatus for continuously depositing on a substrate heated to a high temperature a solid coating resulting from the union of at least two reagents in the gaseous phase, the apparatus comprising:

(a) a source of a first reagent which is gaseous or diluted in a carrier gas;

(b) a source of a second reagent which is gaseous or diluted in a carrier gas;

(c) a nozzle having three tuyeres, each of which has an opening formed by a rectilinear slit and the direction of whose lateral walls, which define the planes of the longitudinal edges of each slit, converges towards a common imaginary line, the first tuyere, which is the central one, being flanked by the other two and adjacent on one hand to the second tuyere at the junction point of their respective walls and, on the other hand, to the third tuyere, also at the junction point of their respective walls, in such a way that the gases emitted by the tuyeres are projected in the direction of the said common line;

(d) first and second deflector surfaces which are rigid with the said nozzle and extend over a determined distance on both sides of the said tuyeres from the longitudinal external edges of the ejection opening of the said and of the third tuyere, respectively;

(e) a first distribution network connecting the source of the first reagent to the first tuyere of the nozzle;

(f) a second distribution network connecting the source of the second reagent to the second and/or to the third tuyere of the nozzle;

(g) means for moving the substrate and the nozzle in a relative movement in a direction substantially perpendicular to the said imaginary line;

(h) means for maintaining constant, during the said relative movement, the distance separating the said openings of the tuyeres of the nozzle and the said deflector surface from the said surface of the substrate; and (i) at least one device for discharging the reaction gases produced in the space between the said deflector surfaces and the surface of the substrate, from the ends of this space which are furthest from the openings of the said nozzle. This apparatus is also characterised in that, of the two deflector surfaces, the one which extends on the side opposite the direction of movement of the substrate relative to the nozzle is perpendicular to the median plane of the nozzle and the edge which it forms at an acute angle with the extended external wall of the third tuyere is transversely offset in the direction of the said movement with respect to the said median plane of the nozzle, the second deflector surface forming, in contrast, an edge having a truncated or rounded angle with the corresponding longitudinal edge of the second tuyere, such that the actual opening of the nozzle disposed between the said edges is bent and the gases emerging from the nozzle are deflected in the direction of movement of the substrate and substantially parallel thereto.

An arrangement of this type permits a further appreciable reduction in the turbulence of the gases leaving the tuyeres, an improvement in their mutual penetration by diffusion, and a further regulation of the progress of the reaction. This results in an improvement in the regularity of the transparency of the coating.

4. BRIEF DESCRIPTION OF THE DRAWINGS

The accompanying drawings represent, by way of example and very schematically, an embodiment of the apparatus which is the subject of the present invention.

5. PREFERRED WAY OF IMPLEMENTING THE INVENTION

Figure 1:
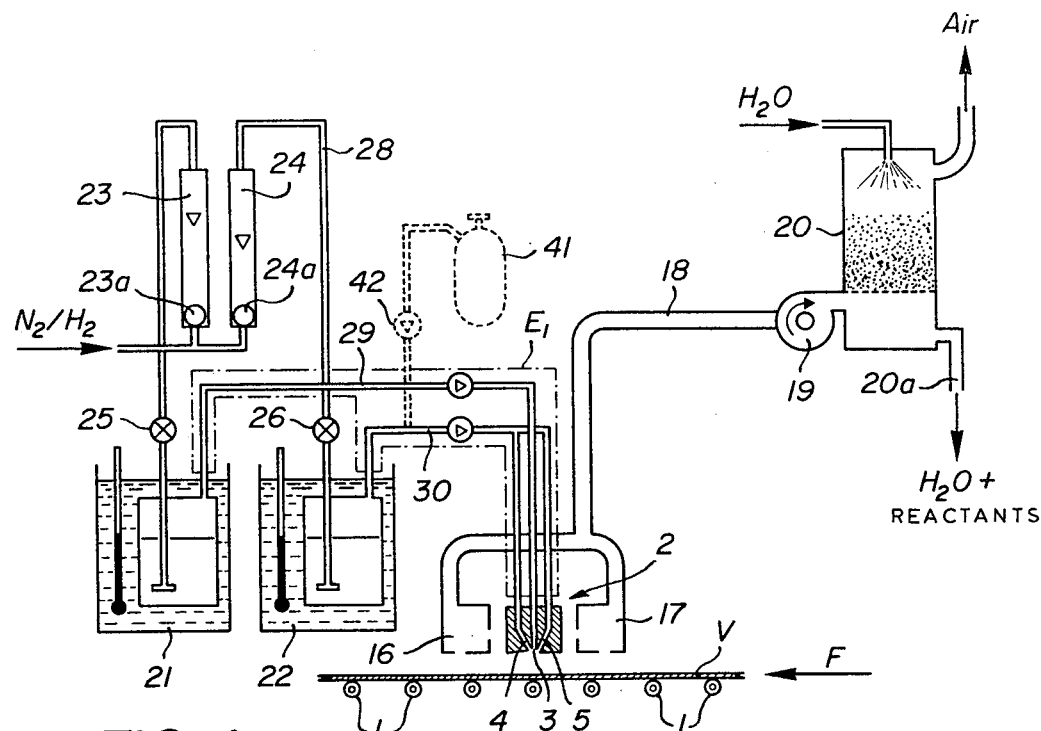
FIG. 1 is a general view.

The apparatus shown in the drawings (FIG. 1) is adapted to deposit (by the CVD technique) on a substrate, in this case a glass sheet V brought to a high temperature, a layer of tin oxide $SnO_2$, using the following chemical reaction:

$$SnCl_4 + 2H_2O \rightarrow SnO_2 + 4HCl \uparrow$$

For this purpose, the apparatus firstly comprises a series of rollers 1, on which the sheet V is placed and moves in the direction F, which are driven in rotation in the anticlockwise direction by an electric motor (not shown) and whose length is of course compatible with the width of the glass sheet to be supported. The rotational speed of the rollers 1 is such that the sheet V moves at a linear speed of several meters per minute, of the order of 1 to 20 m/min depending upon the particular case.

Figure 2:
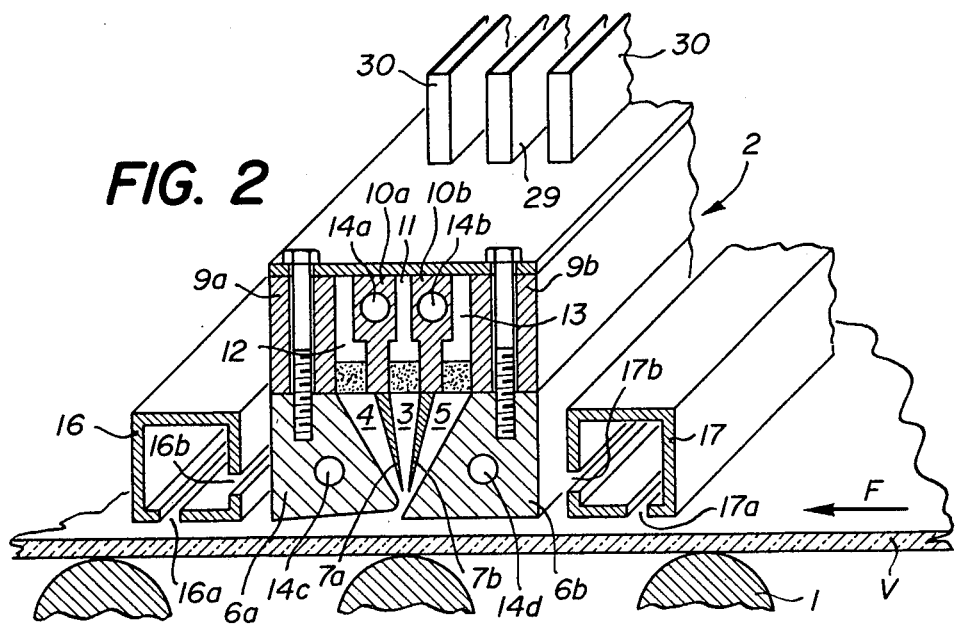
FIG. 2 is a fragmentary perspective view, on an enlarged scale and partially in vertical section, of a part of the apparatus.
Figure 3:
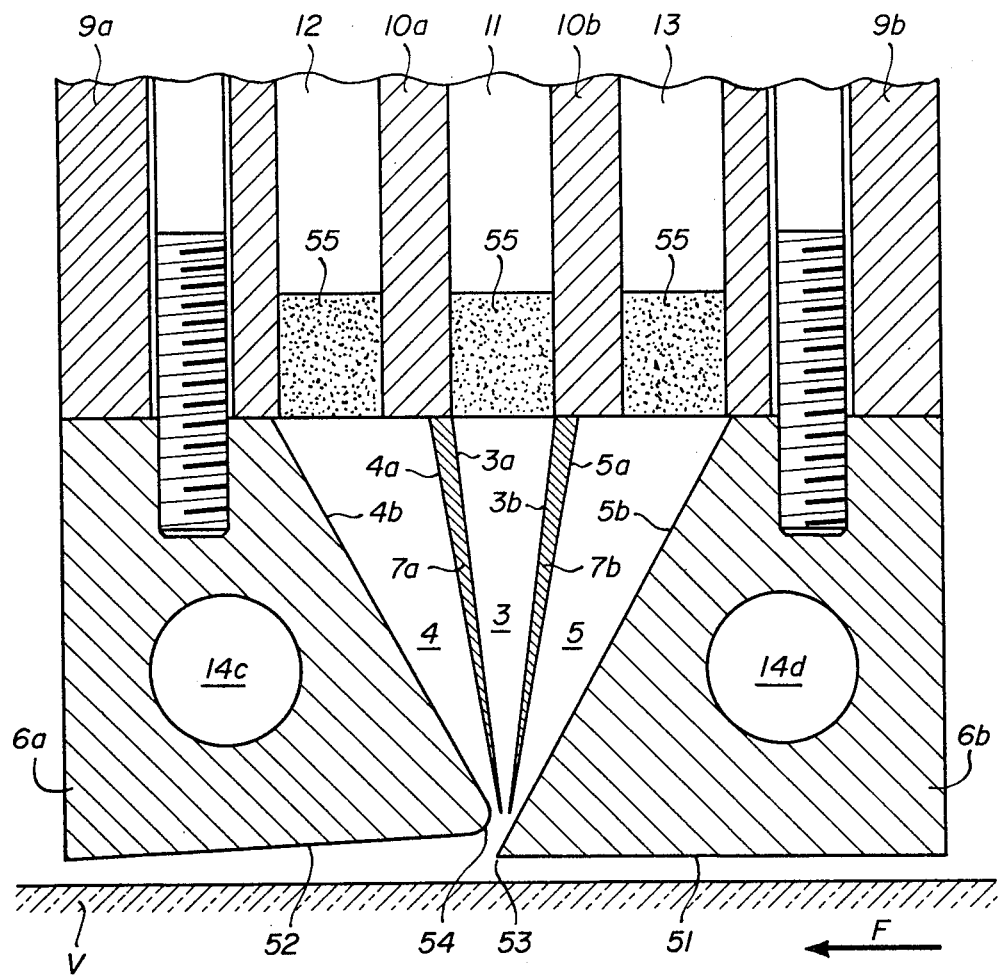
FIG. 3 is an enlarged schematic view of a detail of the part shown in FIG. 2.

Above the series of rollers 1 the apparatus comprises a nozzle 2 whose principal structural profile is the subject matter of FIGS. 2 and 3, which will now be referred to. This nozzle actually comprises three separate jet ducts or tuyeres 3,4,5, which extend longitudinally in a direction parallel to the above-mentioned rollers 1, over a length corresponding to the width of the glass sheet V. The tuyeres 3,4,5, may therefore have a length of several meters. As can be seen from the drawings, the tuyeres 3,4,5 are formed by assembling elongate sections 6a and 6b, 7a and 7b, which are fixed by any adequate means to two pairs of sections 9a and 9b, respectively 10a and 10b, which define between them passages 11,12,13 which communicate with the tuyeres 3,4,5, respectively.

The directions of the lateral walls 3a and 3b, 4a and 4b, 5a and 5b of the tuyeres 3,4,5 converge towards a common imaginary line beyond the lower end of the sections 7a,7b yet in the region of the actual mouth of the nozzle 2. The outlet openings of the tuyeres 3,4,5, which are in the form of three oblong slits extending over the entire length of the sections, have a width of several tenths of a millimeter, for example 1/10 or 8/10 mm.

The width of the lower face of the sections 6a and 6b will preferably be 10 to 20 times the total width of the outlet slits of the tuyeres 3,4,5.

This lower face of the sections 6a and 6b will preferably, but not exclusively, be covered by a layer of a chemically inert metal or an alloy of such metals, or a metallic oxide or oxides. The metal can, for example, be gold or platinum. The oxides can be selected from $SnO_2$, $SiO_2$, or $Al_2O_3$.

In fact, in the presence of certain components of the carrier gas, particularly hydrogen, the usual structural metals and alloys, such as steel or brass, have catalytic properties which are liable to interfere with the control of the desired reaction for obtaining a deposit of $SnO_2$ having the desired mechanical, physical, and optical properties.

The assembly of sections forming the nozzle 2 is of course covered, at each lateral end, by a closing plate (not shown) which is mounted so as to ensure total gas-tightness and thus to form tuyeres 3,4,5 and passages 11,12,13 which are tightly closed laterally. Ducts 14a,b,c,d, which are provided in the sections 10a,10b, 6a,6b over their entire length, permit the circulation of a fluid, for example oil, to be established, which fluid is intended to maintain the nozzle 2 at an optimum operating temperature (of the order of 100 to 160° C.).

Another plate 15 covers the upper face of the nozzle 2 over its entire area and in a gas-tight manner so as to prevent any communication between the passages 11,12 and 13.

It should also be noted that the general profile and the fineness of the surface condition of the walls defining both the tuyeres 3 to 5 and the passages 11 to 13, as well as their cross-sections are such that, for gaseous flows of the order of 3 to 6 l/h per centimeter of length of the nozzle, the flows at the outlet of the tuyeres are laminar.

On both sides of the nozzle 2, and over its entire length, the illustrated apparatus comprises two suction conduits 16 and 17 (FIGS. 1 and 2), which have a square (or any other shaped) cross-section and are disposed adjacent the above-mentioned sections 6a and 6b approximately at the same level as them. The conduits 16,17 each have, according to the embodiment, one or two longitudinal openings (16a and/or 16b for the conduit 16, and 17a and/or 17b for the conduit 17). These conduits are connected by a duct system 18 (FIG. 1) to the inlet of a suction pump 19, which is connected at its outlet to the base of a washing tower 20 filled with refractory materials (Raschig rings).

The apparatus shown in FIG. 1 also comprises two thermostatically-controlled bubbling vessels 21 and 22, the first of which contains liquid stannic chloride, $SnCl_4$, and the second of which contains water, two flowmeters 23 and 24 having respective flow regulating valves 23a and 24a and being supplied with a mixture of nitrogen and hydrogen in a given ratio, for example 60/40 (vol./vol.), two valves 25 and 26 which are disposed on pipes 27 and 28 connecting the flowmeters 23 and 24 to the above bubbling vessels 21 and 22, respectively. Two ducts 29 and 30 connect the outlets of the vessels 21 and 22, respectively, to the passage 11 and to the passages 12 and 13 of the nozzle 2, i.e. in short, to the tuyere 3 for the duct 29 and to the tuyeres 5 and 4 for the duct 30.

The ducts 29 and 30 pass through a tank $E_1$, illustrated schematically in broken line, which contains a heating liquid, for example oil, maintained at a constant temperature of approximately 100° to 130° C. according to the adjustment of the operating conditions, a temperature which is in any case adequate.

As can be seen more particularly from FIG. 3, the deflector surface 51 of the section 6b which extends on the upstream side of the nozzle 2 with respect to the movement of the substrate V relative to the nozzle 2 is parallel to the substrate and the sharp edge 53 which it forms at an acute angle with the extended, external wall 5b of the third tuyere 5 is transversely offset in the downstream direction with respect to the median axial plane of the nozzle. On the other hand, the deflector surface 52 of the section 6a forms with the corresponding longitudinal edge 4b of the second tuyere a rounded (or truncated) blunt edge 54. As a result of this arrangement, the actual opening of the nozzle disposed beyond the junction point of the gases between the edges 53 and 54 is bent and the gases leaving the nozzle are regularly deflected in the direction of movement of the glass sheet V and substantially parallel to the sheet. The gases thus deflected strike the substrate which is to be plated more gently than in the case of the construction described in GB-A-2 044 137 and the regulating degree of turbulence is lowered, which helps to reduce the lack of covering of the coating which occasionally occurs with the earlier device. It should be noted that the second deflector surface 52 can (as illustrated) be inclined towards the substrate in the direction of movement of the substrate, which arrangement accelerates the gases emerging from the nozzle.

It will also be noted that the flow of the gases is likewise regulated by the presence of porous material 55 in the admission ducts 12,13. The porous material may for example, comprise carbon or Teflon fibers ("Teflon" is a Trade Mark for polytetrafluoroethylene).

The apparatus which has just beeen described permits the coating, for example, of a glass plate with a layer of tin oxide having a thickness of the order of 0.5 μm, very good transparency, a relatively high electrical conductivity, a remarkable adhesion to the glass, and a high mechanical strength and resistance to acids.

An experimental apparatus of this type provided with a 20 cm long nozzle, the openings of whose tuyeres 3,4, and 5 has a width of 0.2, 0.1, and 0.1 mm, respectively, permitted the treatment of a glass plate having a width of 20 cm and a thickness of 4 mm, heated to approximately 600° C. and moved in the direction F (FIGS. 1 and 2) at a speed of 1.2 m/min. The distance between the lower face of the nozzle and the surface of the glass was 3 mm. The speed of growth of the deposit was approximately 0.3 μm/s.

Vessels 21 and 22, having a capacity of approximately 200 to 300 ml of liquid SnCl₄ for the vessel 21 and of H₂O for the vessel 22, were used. These vessels were heated to temperatures such that, for flow rates of N₂/H₂ carrier gas of 60 l/h for the vessel 21 and 120 l/h for the vessel 22 (flows regulated by acting on the valves 23a and 24a), a flow of reagent diluted in this gas amounting to 2 mole/h of tin chloride, SnCl₄, and amounting to 1 mole/h of H₂O was obtained. In addition, the temperature of the nozzle was maintained at a value of approximately 120° C. by circulating oil in the ducts 14a,b,c,d of the nozzle.

Taking into account the profile of the tuyeres 3,4,5 of the nozzle 2, and in particular the fact that their lateral walls converge towards a common imaginary line, the gaseous flows (which are laminar) leaving these delivery tubes, i.e. a flow containing H₂O vapor from the tuyeres 4 and 5, come into mutual contact firstly by tangentially brushing one another, then more directly as the substrate to be plated is approached. The combined flow of these three gaseous flows evidently becomes more turbulent as these three flows abruptly interpenetrate. This is why, owing to the arrangement of the deflector surfaces 51 and 52, this interpenetration is delayed and takes place gently at the surface of the glass V, which is heated to approximately 600° C., as described, such that the combination reaction

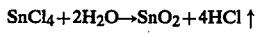

$$SnCl_4 + 2H_2O \rightarrow SnO_2 + 4HCl \uparrow$$

takes place on the glass. It should be noted at this point that other special measures can be taken to moderate the conditions of the reaction and prevent the formation, in certain cases, of large amounts of tin oxide (SnO₂) and of hydrates of the SnO₂.nH₂O type at the outlet of the tuyeres of the nozzle 2, where there is a risk of partial or total obstruction of all or some of the tuyeres, with a deposit of these same tin oxides on the glass in the form of a white film and not in the form of the desired transparent semiconductor layer.

In order to do this, it is possible to add a reducing agent to the two gaseous flows of SnCl₄ and of H₂O vapor. This agent consists of hydrogen comprised in the carrier gas. Hydrogen is in fact a gas which does not react either with SnCl₄ or with H₂O. It can therefore be used as an inert carrier gas.

The combination reaction of SnCl₄ and H₂O not only takes place in the central zone of the nozzle 2, i.e. in the vicinity of the part of this nozzle into which the tuyeres 3,4,5, open. In fact this reaction takes place when the pump 19 is operating such that, through the conduits 16 and 17 disposed on either side of the nozzle, a depression is created at the right and left ends (in the drawings) of the space between the glass plate V and the lower face of the sections 6a and 6b of the nozzle. As a result, a gaseous flow forms in this space from the central part of the space towards the above-mentioned conduits 16 and 17. This flow particularly contains an amount of SnCl₄ and H₂O dispersed in the carrier gas and not yet having reacted, the HCl vapors which have already formed, and a certain amount of carrier gas which is free of the reagents which have already reacted. The reaction between SnO₂ and H₂O may thus continue with the residual reactive gases over a certain length of the space, on either side of the line of convergence of the tuyeres. On account of the deflection imparted to the gases in the downstream direction, the conduit 16 obviously collects more spent gases than the conduit 17.

The suction power provided by the ducts 16 and 17 is selected such that the reactive gases emerging from the nozzle 2 only remain in this space for the period which is strictly necessary to obtain a deposit of SnO₂ on the glass, a deposit which is in the form of a transparent layer and not in the form of a growth of SnO₂ powder. The suction must not of course be too strong, as otherwise the reactive gases emerging from the nozzle would not have time to reach the surface of the glass. The intensity of the suction is therefore a determining factor as regards the quality and the speed of growth of the layer. It should also be noted that owing to this suction, the space between the nozzle and the glass plate in which the desired reaction takes place is isolated, as it were, from the ambient atmosphere and any penetration into this space by additional humidity, which is liable to affect the combination reaction, is prevented, as is any escape, towards this same ambient atmosphere, of noxious vapors, for example of HCl, or of hydrogen, the ambient air having a tendency to flow towards the slits 16a,16b or 17a,17b while passing between the conduit 16 or 17, on the one hand, and the glass plate V and the nozzle 2, on the other hand.

The gaseous products which are drawn in by means of the pump 19 are directed, as described, towards the washing tower 20, such that the volatile residual acids are percolated and entrained by water, the resultant acid solution being separated from the washed gases and discharged through a duct 20a.

In the operating conditions described above, the reactive yield was approximately 60%. The glass was covered over its entire surface with a layer of SnO₂ having a thickness of 0.5 μm, a transparency of 80 to 90%, according to the samples, and an average resistance $R_\square = 100\Omega$.

Furthermore, the layer of SnO₂ which was thus obtained has proved to have a particularly high degree of hardness, higher than that of the glass on which it was deposited. Its resistance was therefore very high, whether to the most intense mechanical stresses, to impact for example, or to attack by acids. In particular, this glass could be subjected to a bending operation with a radius of curvature of 15 cm, after having been brought to a temperature of between 600° and 700° C., without any deterioration in the SnO₂ coating. It was possible to temper it under the usual conditions for normal glass. Finally, it should be noted that a glass plate coated with a SnO₂ layer, in the conditions and according to the method described above, can be diamond cut from the obverse or the reverse of the plate without the coating layer being chipped.

There will now be a description of a variant of the apparatus of FIG. 1, a variant which is particularly intended for industrial uses. This variant is schematically illustrated in FIG. 4, in which the same reference numerals have been used as in FIG. 1 when the elements described are common to the two Figures.

Figure 4:
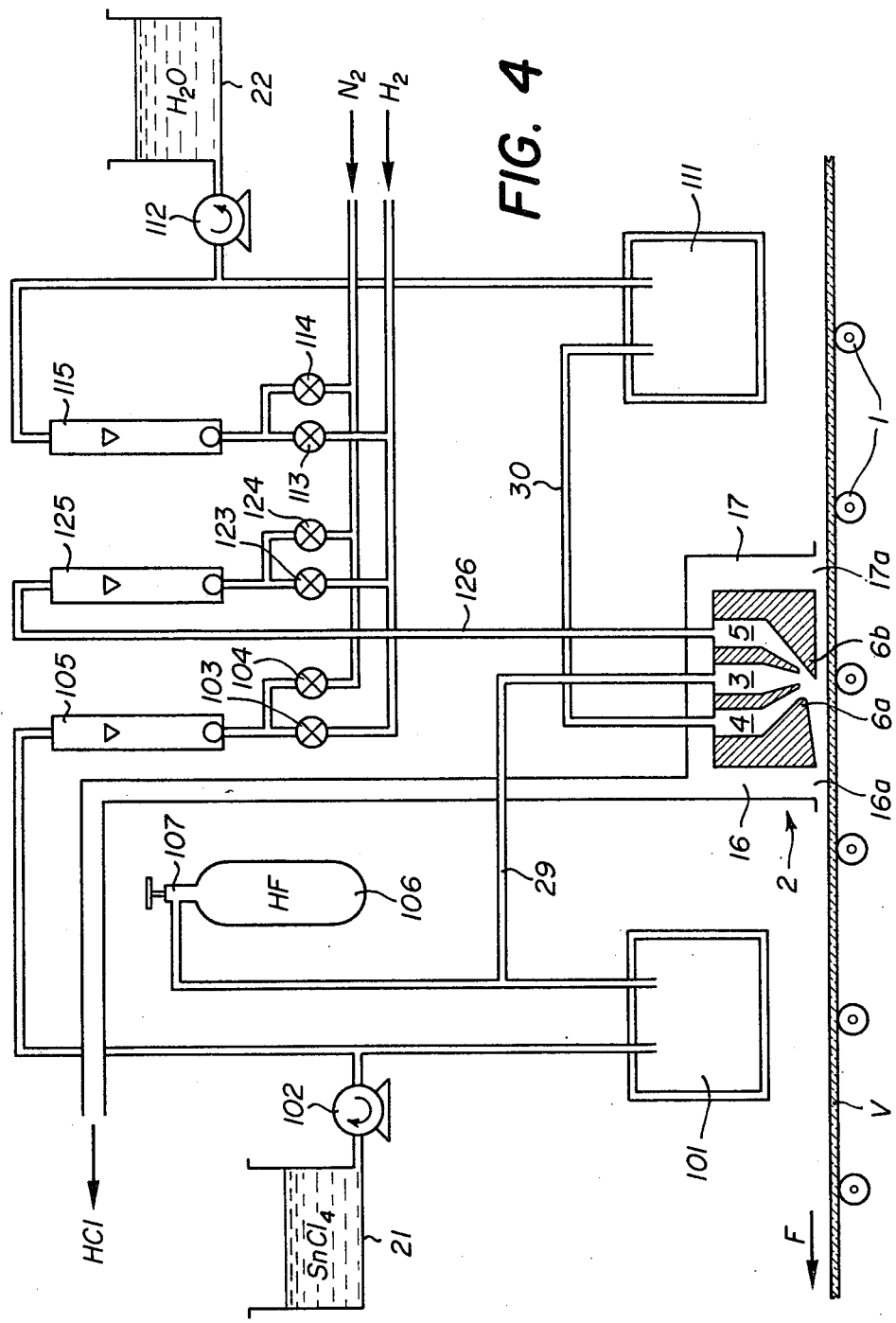
FIG. 4 is a schematic illustration of a variant of the apparatus of FIG. 1, in which only one of the lateral tuyeres is connected to one of the reagent sources, while the other lateral tuyere is connected by way of a third distribution network to a source of the carrier gas.

In addition to the nozzle 2 adapted to project the reagents onto the glass plate V, as already described for FIG. 1, the apparatus of FIG. 4 comprises a suction system 16,17 for the spent gases, a first SnCl₄ supply network comprising a tank 21 of stannic chloride, an evaporator 101 heated to 120° to 150° C., and a metering pump 102, which permits a measured flow of SnCl₄ to reach the evaporator. The evaporator 101 is also swept by a flow of carrier gas (N₂ or an N₂/H₂ mixture) having a flow rate regulated by valves 103 and 104 and measured by a rotameter 105. Furthermore, an HF cylinder 106 permits the SnCl4 to be doped with fluorine by means of a valve 107. This first supply network is connected to the central tuyere 3 by way of the duct 29.

The apparatus also comprises a second supply network, this time of water, which is connected to the tuyere 4 by the duct 30 and comprises a water tank 22, an evaporator 111, a pump 112, valves 113 and 114, and a flowmeter 115.

Finally, the apparatus comprises a third supply network, solely of carrier gas, which comprises valves 123 and 124, a flowmeter 125, and a supply duct 126, which is connected to the tuyere 5. The remaining elements of this variant of the apparatus, whether or not represented in the drawing, are similar to those already described in connection with FIGS. 1 to 3.

The operation of this variant is approximately the same as that of the previously described apparatus, although it is more versatile and is better suited for industrial uses owing to the possibility of independently regulating the reagent flows (by the pumps 102 and 112) and the carrier gas flows. The supply of carrier gas alone through the tuyere 5 permits the regularity of the reaction to be improved further.

The apparatus just described was used to treat a strip of "float" glass having a width of 3 m and travelling at 11.5 m/min in the area between the outlet of the molten Sn bath and the inlet of the annealing furnace. The apparatus comprised a set of five nozzles similar to the nozzle 2, with a 1 m span, disposed in series and offset so as to cover the entire width of the glass. The tuyeres were supplied in the following manner:

Tuyeres 3 : SnCl4, total flow : 1.44 Nm$^3$/h; carrier gas (N2/H2, 60/40) : 1.06 Nm$^3$/h.
Tuyeres 4 : H2O (5% HF) total flow : 0.92 Nm$^3$/h ; carrier gas (N2/H2) : 1.58 Nm$^3$/h.
Tuyeres 5 : carrier gas (N2/H2) : 2.5 Nm$^3$/h.
(Nm$^3$ = cubic meters at normal temperature and pressure.)

The total flow was thus 0.5 Nm$^3$/h/tuyere; the width of the slit of the tuyeres was 0.4 mm. A coating of SnO2 with a thickness of 0.14 um, a resistance R□=90Ω, and a transparency of 90% in visible light was obtained in these conditions.

The apparatus which has been described with reference to FIGS. 1 to 3 can also be used to deposit, by CVD a layer of TiO2 on a glass plate. For this purpose it is sufficient to replace the tin chloride SnCl4 in the bubbling vessel 21 by titanium chloride TiCl4. It is possible to use a carrier gas consisting solely of nitrogen.

The reaction which will take place at the outlet of the nozzle 2 will be as follows:

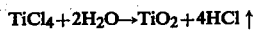

In a specific case a glass plate having a width of 20 cm, a thickness of 4 mm, and heated to a temperature of 600° C. was moved in the longitudinal direction at a speed of 1.2 um/min in front of the nozzle 2 and at a distance of 3 mm from it. By acting on the valves 23a and 24a, the flow of the carrier gas was set at 60 l/h for the flowmeter 23 and at 120 l/h for the flowmeter 24. The vessels 21 and 22 were also heated so as to obtain a reagent flow of 0.2 mole/h of TiCl4 and 0.01 mole/h of H2O.

A layer of TiO2 was obtained which had a thickness of 0.01 μm, a transparency to visible light of approximately 75%, and a reflecting power with respect to visible light greater than that of the glass supporting the deposit. The mechanical strength was comparable to that of a deposit of SnO2 obtained in the above-described manner.

Broadly speaking, the resistance, the reflecting power, and the transparency of SnO2 layers of a thickness of more than 0.5 μm on glass can be greatly improved if these layers are doped with fluorine. For this purpose, the apparatus described with reference to FIG. 1 is preferably used, together with a cylinder 41, containing gaseous HF, and a duct 42, which connects the cylinder to the duct 30, all these parts being illustrated in broken line in FIG. 1.

Glass having a thickness of 4 mm and brought to a temperature of approximately 600° C. was covered with a layer of 0.75 μm SnO2 doped with fluorine by passing in front of the nozzle at a speed of 1.2 m/min and at a distance of approximately 3 mm from the nozzle. The carrier gas flows (a mixture of N2 40% H2) were 60 l/h for the SnCl4 and the water vapor. The HF flow was 0.1 l/min.

The deposit of SnO2 doped with fluorine proved to have a particularly good performance. In fact its resistance was R□=6Ω, its reflecting power with respect to visible light was greater than that of the glass supporting the deposit, and its reflecting power with respect to infrared proved to be particularly high, of the order of 75%. Furthermore, its transparency to visible light was 85%. The mechanical strength characteristics were also very high : the glass coated with SnO2 doped with fluorine could undergo a thermal annealing treatment identical to those to which certain panes of vehicles are traditionally subjected, for example the lateral panes of motor cars. It was also possible to bend a plate of this type under heat (temperature of approximately 650° C.) with radii of curvature of 15 cm without modifying the characteristics of the doped SnO2 deposit. In addition, a glass plate covered in the described manner could be worked in the traditional manner (cutting, grinding, etc.) without the deposit being damaged. The layer of SnO2 doped with F in fact had a hardness greater than that of the glass which supported it and could not be scratched. Furthermore its chemical resistance to acids and its resistance to impacts proved to be particularly high.

It is also possible to dope the SnO2 of the deposit with antimony. In order to do this, it is possible either to mix SbCl5 with the SnCl4 of the bubbler 21 or connect an additional bubbling vessel containing SbCl3 to the inlet duct 29 to the central tuyere 3 of the nozzle 2.

It should be noted in this connection that a layer of SnO2 doped with fluorine or antimony and deposited on a glass plate in the above-mentioned conditions can be covered with silver or a silver paint deposited at 600° C., for example in order to form electrical contacts. A silver deposit of this type adheres very well to the surface of the SnO2 deposit.

The uses of glass plates of all dimensions coated with a layer of SnO2, whether or not doped with antimony or fluorine, can be very varied according to their qualities, particularly of a physical and electrical nature.

Although a non-doped layer of SnO2 has a relatively high resistance, if it is compared with the resistance of a similar layer doped with antimony or fluorine, a glass plate covered with a layer of this type can be used, for example, to form windows or French windows of dwelling places, ships, or trains, taking into account its good transparency to visible light and its relatively high reflecting power with respect to infrared.

This insulating power is evidently greater in the case of glass covered with $SnO_2$ doped with antimony, or glass covered with $SnO_2$ doped with fluorine. Furthermore, as the resistance of such layers was quite low for a layer of $SnO_2$ doped with antimony and very low for the layer doped with fluorine, it is possible to use panes covered with doped $SnO_2$ as heater panes, for example as rear vehicle windows.

It has also been observed that, if placed in a very humid atmosphere, a glass plate comprising a deposit of $SnO_2$, either not doped or doped with antimony in the same way as with fluorine, does not become covered with a uniform layer of vapor, but with a plurality of droplets which impairs to a far lesser degree the visibility capacity through the actual deposit and the glass plate.

This characteristic is obviously particularly advantageous in the case of glass plates which are intended to form window panes, particularly window panes of vehicles and, more particularly, windscreens and rear windows of motor cars, buses, and lorries.

It should finally be noted that, although mentioned within the scope of the method and apparatuses described with reference to FIGS. 1 to 3 of the accompanying drawings, the use of hydrogen as a means of controlling the combination reaction of $SnCl_4$ and $H_2O$ could also take place, for the same purposes and with the same benefits, if a reaction of this type was obtained by using methods and apparatuses of another nature operating according to the CVD technique, such as those described by H. Koch in the above-mentioned article or by DE-A-2 123 274.

6. POSSIBILITIES OF INDUSTRIAL APPLICATIONS

The following example illustrates the invention in detail.

The apparatus as illustrated in FIG. 1 was used with a nozzle like the one illustrated in FIG. 3 and the operation was carried out in the following conditions:

| | |
|---|---|
| Reactive temperature of the substrate | 590° C. |
| Operational pressure | atmospheric |
| Water vapor flow (line 30) | 10 mole/h (approx. 250 l/h) |
| Concentration of HF in $H_2O$ | 2/98 (vol./vol.) |
| Composition of carrier gas | $H_2/N_2$: 40/60 (vol./vol.) |
| Flow of gas vessel 21 ($SnCl_4$) | 370 l/h |
| Temperature of vessel 21 | 120° C. |
| Flow of $SnCl_4$ | 10 mole/h |
| Speed of movement of the glass V | 1.2 m/mn |
| Suction rate of the reaction gases | 1500 l/h |
| Flow of the carrier gas | 500 l/h. |

A deposit having the following characteristics was thus obtained: thickness, 0.6 μm; resistance $R_\square$, 20Ω; transparency, 80%.

If, in the above example, the nozzle with a bent flow of the present invention is replaced by a nozzle according to GB-A-2 044 137, i.e. with a flow perpendicular to the substrate, similar results are obtained, although traces of mist are occasionally observed on the $SnO_2$ deposits.

We claim:

1. In apparatus for continuously depositing on a substrate heated to a high temperature a solid coating resulting from the union of at least two reagents in the gaseous phase, comprising :

(a) a first source of a first reagent, which is gaseous or diluted in a carrier gas;

(b) a second source of a second reagent, which is gaseous or diluted in a carrier gas;

(c) a nozzle having three tuyeres, each tuyere having an opening formed by a rectilinear slit and lateral walls which define the planes of the longitudinal edges of the slit, the direction of the lateral walls converging towards a common imaginary line, a first said tuyere being flanked by the other two and being adjacent, on one hand, to a second said tuyere at the junction point of their respective walls and, on the other hand, to a third said tuyere at the junction point of their respective walls, so that gases ejected by the tuyeres are projected towards the said common line;

(d) first and second deflector surfaces which are rigid with the nozzle and which are to face the substrate, the said deflector surfaces extending over a given distance on respective sides of the tuyeres from the external longitudinal edges of the openings of the second and third tuyeres, respectively;

(e) first distribution means connecting the first reagent source to the first tuyere of the nozzle;

(f) second distribution means connecting the second reagent source to at least one of the second and third tuyeres of the nozzle;

(g) means for moving the substrate and the nozzle relative to each other in a direction substantially perpendicular to the said imaginary line and parallel to the substrate, while maintaining constant, during the relative movement, the distance separating the tuyere openings and the deflector surfaces from the substrate; and (h) means for removing from the space between the deflector surfaces and the substrate reaction gases produced in this space;

the improvement that the first deflector surface extends on the upstream side with respect to the direction of movement of the substrate relative to the nozzle and is perpendicular to the median plane of the nozzle, the first deflector surface forming a sharp edge at an acute angle with the external wall of the third tuyere, which wall is extended beyond the internal wall, the sharp edge being transversely offset in the direction of the said movement with respect to the said median plane of the nozzle, the second deflector surface forming, in contrast, a blunt edge with the corresponding external longitudinal wall of the second tuyere, such that a nozzle opening defined between the said edges is bent and the gases emerging from it are deflected in the direction of movement of the substrate and substantially parallel to the substrate.

2. The apparatus of claim 1, in which only one of the second and third tuyeres is connected to the second distribution means, third distribution means connecting the remaining tuyere to a source of carrier gas.

3. The apparatus of claim 1, in which the second deflector surface is inclined towards the substrate in the direction of relative movement of the substrate, so as to steadily accelerate gases advancing in the downstream direction.

4. The apparatus of claim 1, in which the width of the slits forming the openings of the tuyeres of the nozzle is at least 1/10 mm and at most 8/10 mm.

5. The apparatus of claim 1, in which the deflector surfaces each extend over a distance which is 10 to 20 times the transverse dimensions of the slits forming the openings of the tuyeres.

* * * * *